US012687462B2

(12) United States Patent
Cuevas et al.

(10) Patent No.: US 12,687,462 B2
(45) Date of Patent: Jul. 21, 2026

(54) DOUBLE SPLINE RING ADAPTER FOR TORQUE CONVERTER TESTING

(71) Applicant: Schaeffler Technologies AG & Co. KG, Herzogenaurach (DE)

(72) Inventors: Andres Cuevas, Puebla (MX); Diego Alejandro Ledesma, Puebla (MX); Juan Pablo Cazares, Puebla (MX)

(73) Assignee: Schaeffler Technologies AG & Co. KG, Herzogenaurach (DE)

( * ) Notice: Subject to any disclaimer, the term of this patent is extended or adjusted under 35 U.S.C. 154(b) by 1045 days.

(21) Appl. No.: 17/861,408

(22) Filed: Jul. 11, 2022

(65) Prior Publication Data

US 2024/0011867 A1     Jan. 11, 2024

(51) Int. Cl.
*G01M 15/02* (2006.01)
*F16D 1/10* (2006.01)
*F16D 1/112* (2006.01)
*G01R 31/34* (2020.01)

(52) U.S. Cl.
CPC ............. *G01M 15/02* (2013.01); *F16D 1/112* (2013.01); *G01R 31/34* (2013.01); *F16D 2001/103* (2013.01)

(58) Field of Classification Search
CPC ..... G01M 15/02; G01M 13/022; F16D 1/112; F16D 2001/103; F16D 1/10; F16D 41/066; G01R 31/34
USPC ........................................................ 73/866.4
See application file for complete search history.

(56) References Cited

U.S. PATENT DOCUMENTS

| | | | | | |
|---|---|---|---|---|---|
| 6,026,642 | A | * | 2/2000 | Myers ..................... | F16D 41/07 60/345 |
| 9,951,852 | B2 | * | 4/2018 | Caldwell ............... | F16D 41/066 |
| 2009/0088261 | A1 | * | 4/2009 | Clark ................ | F16F 15/12346 464/68.1 |
| 2016/0017929 | A1 | * | 1/2016 | Sugiyama ............... | F16D 1/116 464/142 |

FOREIGN PATENT DOCUMENTS

CN       210347133 U  *  4/2020
JP       2004324753 A  *  11/2004

* cited by examiner

*Primary Examiner* — Marrit Eyassu
(74) *Attorney, Agent, or Firm* — Volpe Koenig

(57)                ABSTRACT

A spline adapter assembly for connecting a torque converter one-way clutch to a shaft for testing. The spline adapter assembly includes an inner race ring including a radially outer roller body contact surface and a radially inner interface surface, and an adapter having a radially outer interface surface that is complementary to and engaged with the radially inner interface surface of the inner race ring and a radially inner shaft interface surface. The inner race ring of the spline adapter assembly replaces the original inner one-way clutch race ring and can be machined for each assembly being tested in order to provide the proper radially outer roller body contact surface configuration, and is connected to a universal adapter that mates with the test equipment.

11 Claims, 7 Drawing Sheets

DOUBLE SPLINE RING ADAPTER FOR TORQUE CONVERTER TESTING

FIELD OF INVENTION

The disclosure relates to an adapter used for testing various configurations of a one-way clutch in a torque converter.

BACKGROUND

The inner ring constitutes a crucial component of the one way clutch of a torque converter, but also, its particular manufacturability results in this component not having significant adaptability. This has great importance mainly in the testing environment, when a number of times, special tooling is not available causing a delay on performance tests and thus, new or benchmarking developments are delayed. Every time a component with a new spline is intended to be performance tested, it requires the complete development of the required tooling, causing delays of up to several months.

It would be desirable to provide a faster and more reliable way to adapt the torque converter components and/or the test equipment for different configurations.

SUMMARY

In one aspect, a spline adapter assembly is provided for connecting a torque converter one-way clutch to a shaft for testing. The spline adapter assembly includes an inner race ring including a radially outer roller body contact surface and a radially inner interface surface, and an adapter having a radially outer interface surface that is complementary to and engaged with the radially inner interface surface of the inner race ring and a radially inner shaft interface surface. Here, the inner race ring of the spline adapter assembly replaces the original inner one-way clutch race ring. The adapter assembly inner race ring may be machined for each assembly being tested in order to provide the proper radially outer roller body contact surface configuration, or a stock of standard size adapter inner race rings is developed and/or maintained from prior testing for different torque converter one-way clutch configurations, with each preferably having the same radially inner interface surface. This allows one universal adapter (or even several) having a radially outer interface surface that is complementary to a standard or common radially inner interface surface of the inner race rings to be maintained that has a universal radially inner shaft interface surface configuration (or one of several universal radially inner shaft interface surface configurations) that matches the existing test equipment. This can reduce the time originally required to make the interface tooling down from 12-14 weeks to 1-2 weeks if only the inner race ring of the spline adapter assembly has to be machined and an existing adapter can be used to mate with the test equipment.

In one aspect, the inner race ring includes a cavity having an axial side wall and a radial outer wall, and the radially inner interface surface forms at least a part of the radial outer wall of the cavity. Here, the adapter is held axially between the axial side wall and a reactor side plate.

In one embodiment, the adapter is formed of a steel plate. This can be conventionally machined, formed by EDM machining, or by any other suitable means.

In another embodiment, the adapter is formed of a series of flat, laser-cut, steel sheets that are stacked on top of one another. This provides the advantage of fast production from thin steel sheets that can be stacked together. This also allows for easier maintenance if either the radially inner shaft interface surface or the radially outer interface surface are damaged, as only the laser-cut, steel sheets in the stack that are damaged can be individually replaced.

In another aspect, the radially inner interface surface of the inner race ring includes a plurality of teeth, and the radially outer interface surface of the adapter includes a plurality of corresponding teeth. These teeth can be relatively large, and therefore machining tolerances can be greater than in comparison with the radially inner shaft interface surface.

In another aspect, the radially inner shaft interface surface includes a splined opening.

In another aspect, a second inner race ring is provided including a radially outer roller body contact surface that is different from the radially outer roller body contact surface of the inner race ring, and the second inner race ring has a radially inner interface surface that is the same as the radially inner interface surface of the inner race ring. This allows the adapter to be used with different inner race rings.

In a further aspect, a method of mounting a torque converter stator having a one-way clutch for testing, with the method including (a) providing a torque converter stator, (b) inserting a spline adapter assembly in place of a one-way clutch inner race ring into the torque converter stator, with the spline adaptor assembly including an adapter inner race ring having a radially outer roller body contact surface and a radially inner interface surface, and an adapter having a radially outer interface surface that is complementary to and engaged with the radially inner interface surface of the inner race ring and a radially inner shaft interface surface, and (c) connecting the radially inner shaft interface surface with a test machine shaft having a complementary configuration.

The method may further include providing the inner race ring with a cavity having an axial side wall and a radial outer wall, and the radially inner interface surface forms at least a part of the radial outer wall of the cavity.

The method can further include holding the adapter axially between the axial side wall and a reactor side plate, which also holds the one-way clutch components in place.

The method can include forming the adapter from a steel plate, as explained above. Alternatively, the method can include forming the adapter from a series of flat, laser-cut, steel sheets that are stacked on top of one another.

In another aspect, the method includes providing the radially inner interface surface with a plurality of teeth, and providing the radially outer interface surface of the adapter with a plurality of corresponding teeth.

In another aspect, the method includes providing the radially inner shaft interface surface as a splined opening.

Various features of the invention can be used alone or in combination in order to achieve one or more of the benefits described herein.

BRIEF DESCRIPTION OF THE DRAWINGS

The foregoing Summary and the following detailed description will be better understood when read in conjunction with the appended drawings, which illustrate preferred embodiments according to the disclosure. In the drawings.

DETAILED DESCRIPTION

Figure 1:
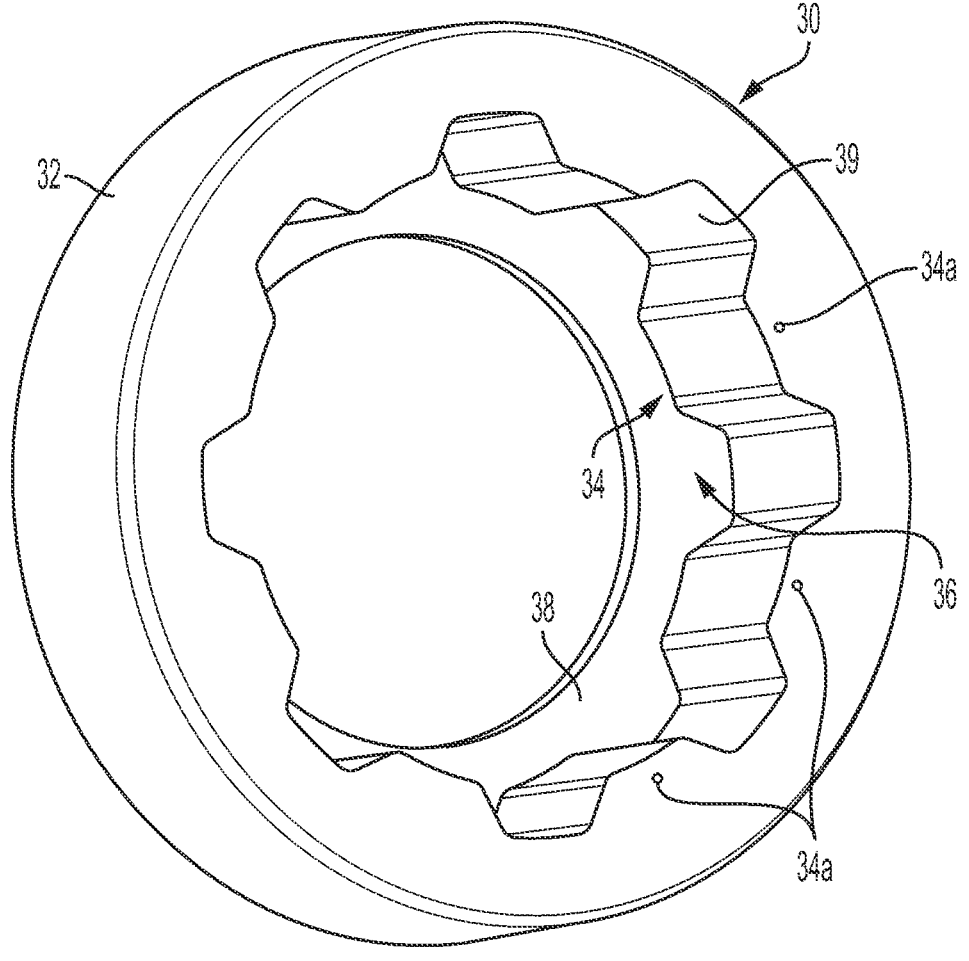
FIG. 1 is a perspective view of an inner race ring for a first embodiment of a spline adapter assembly according to the disclosure.

Certain terminology is used in the following description for convenience only and is not limiting. The words "inwardly" and "outwardly" refer to directions toward and away from the parts referenced in the drawings. "Axially" refers to a direction along the axis of a shaft. "Radially" refers to a direction approximately normal to an axis. A reference to a list of items that are cited as, for example, "at least one of a or b" (where a and b represent the items being listed) means any single one of the items a or b, or a combination of a and b thereof. This would also apply to lists of three or more items in like manner so that individual ones of the items or combinations thereof are included. The terms "about" and "approximately" encompass + or −10% of an indicated value unless otherwise noted. The terminology includes the words specifically noted above, derivatives thereof and words of similar import.

Figure 2:
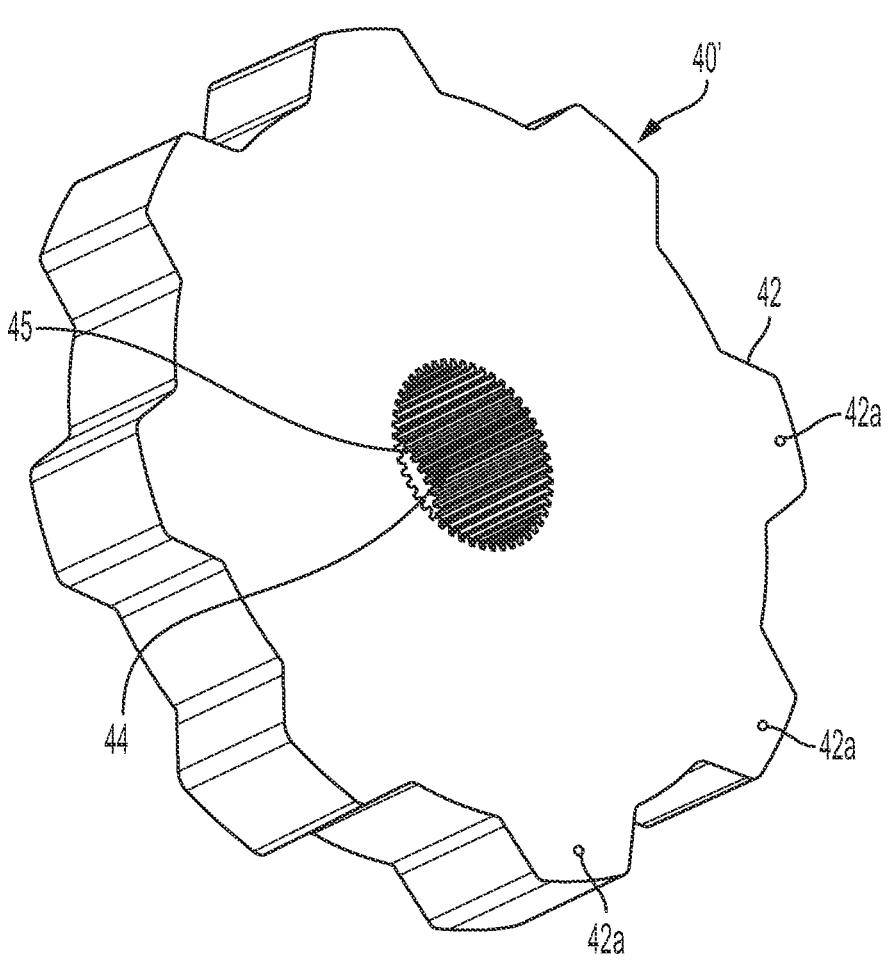
FIG. 2 is a perspective view of one embodiment of an adapter for use in the inner race ring according to the first embodiment shown in FIG. 1 to form a spline adapter assembly according to the disclosure.
Figure 3:
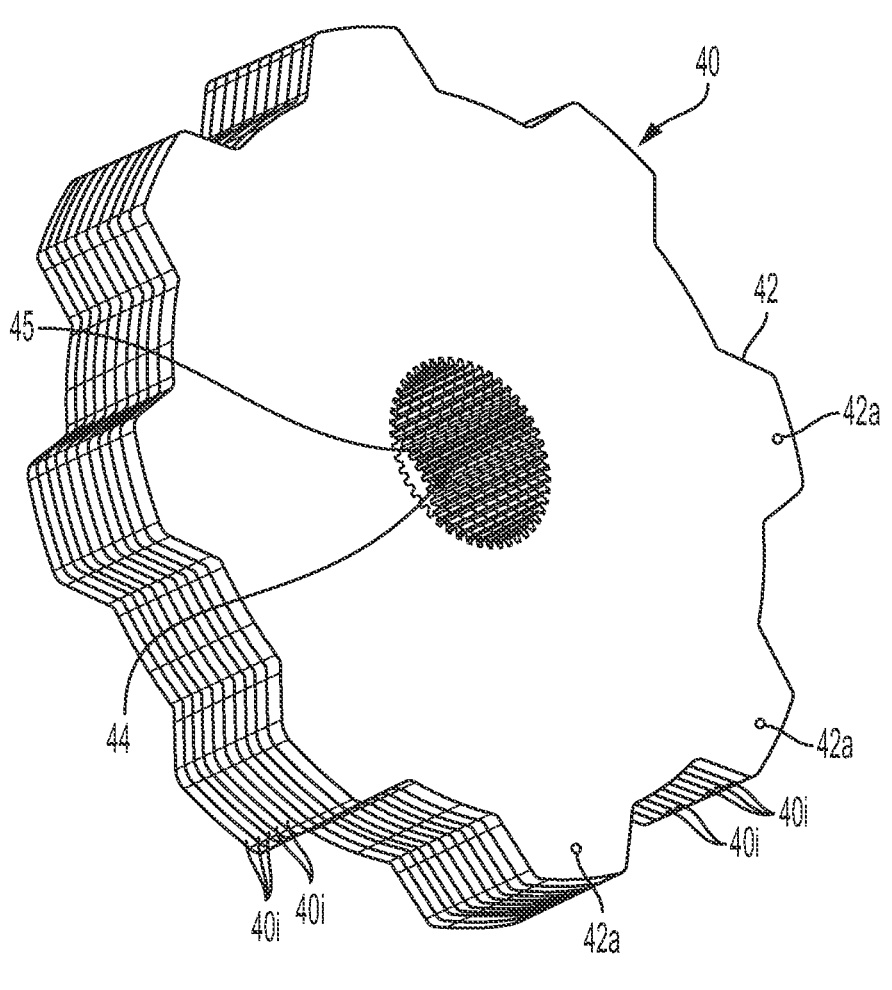
FIG. 3 is a perspective view of another embodiment of an adapter for use with the inner race ring according to the first embodiment shown in FIG. 1 to form a spline adapter assembly according to the disclosure.
Figure 4:
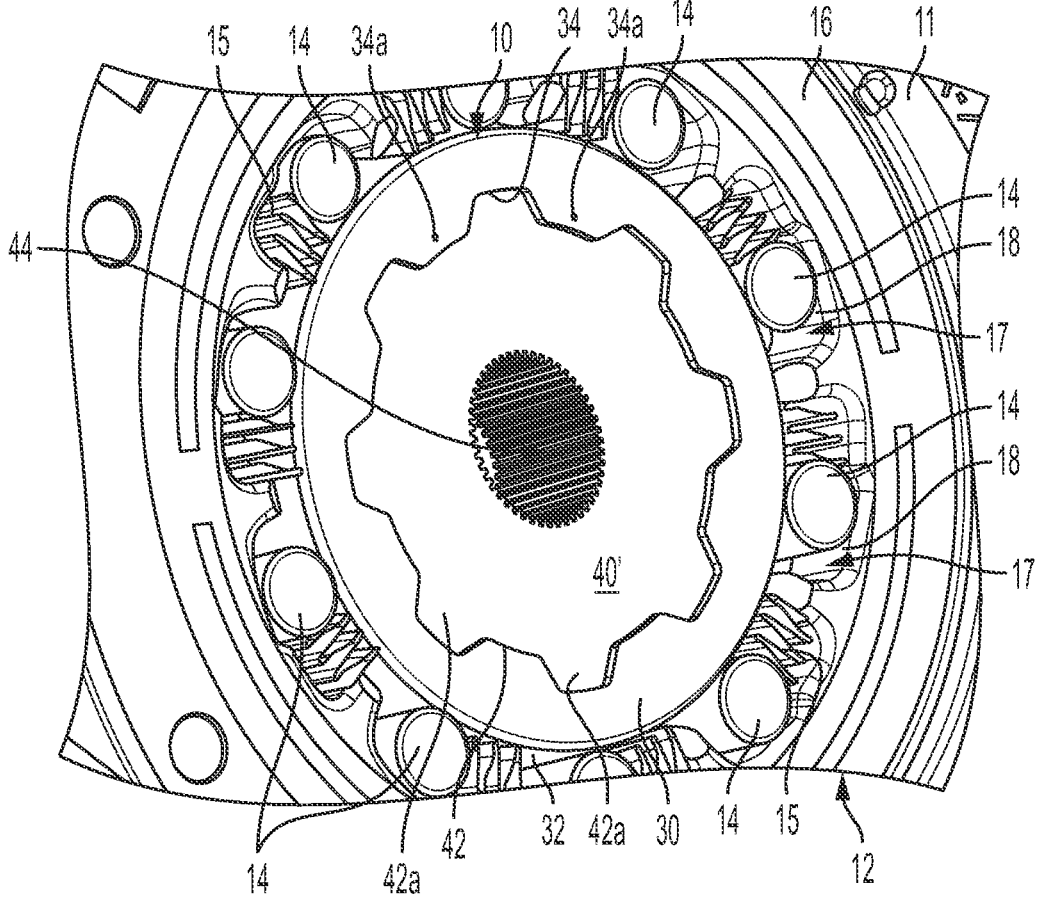
FIG. 4 is a perspective view showing one embodiment of the spline adapter assembly, including the inner race ring shown in FIG. 1 and the adapter shown in FIG. 2, assembled with a torque converter one-way clutch in order to allow connection to a shaft for testing.
Figure 5:
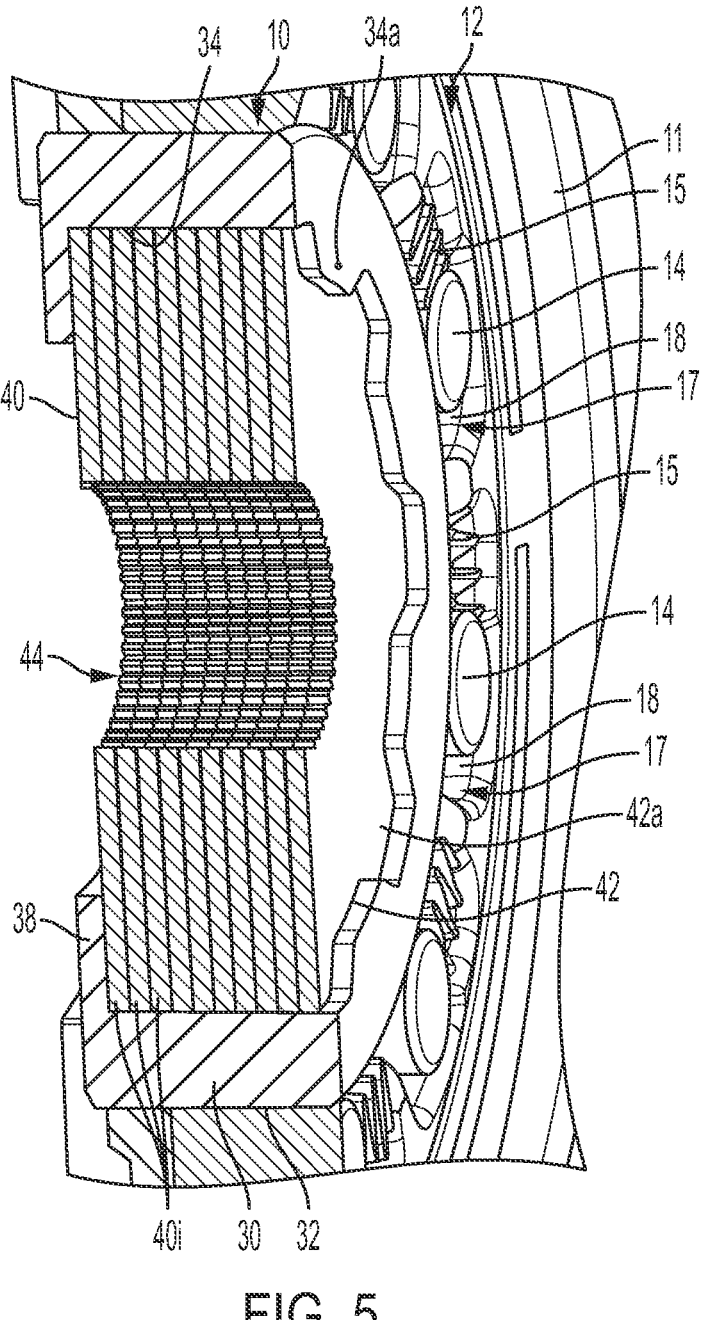
FIG. 5 is a perspective view, in cross-section, of another embodiment of the spline adapter assembly, including the inner race ring shown in FIG. 1 and the adapter shown in FIG. 3, assembled with a torque converter one-way clutch in order to allow connection to a shaft for testing.

Referring to FIGS. 1-5, a spline adapter assembly 10 for connecting a torque converter one-way clutch 12 to a shaft 20 (shown in FIGS. 6 and 7) of existing test equipment is shown. The spline adapter assembly 10 includes an inner race ring 30 having a radially outer roller body contact surface 32 and a radially inner interface surface 34 as shown in FIGS. 1 and 4. An adapter 40, 40' having a radially outer interface surface 42 that is complementary to and engaged with the radially inner interface surface 34 of the inner race ring 30 and a radially inner shaft interface surface 44 is also provided. The adapter 40 can be formed of a series of flat, laser-cut steel sheets 40*i* that are stacked upon one another, as shown in FIG. 3. Alternatively, the adapter 40' can be formed of a single steel plate as shown in FIG. 2.

As shown in FIG. 1, the inner race ring 30 includes a cavity 36 having an axial side wall 38 and a radial outer wall

39, and the radially inner interface surface 34 forms at least a part of the radial outer wall 39 of the cavity 36.

Figure 6:
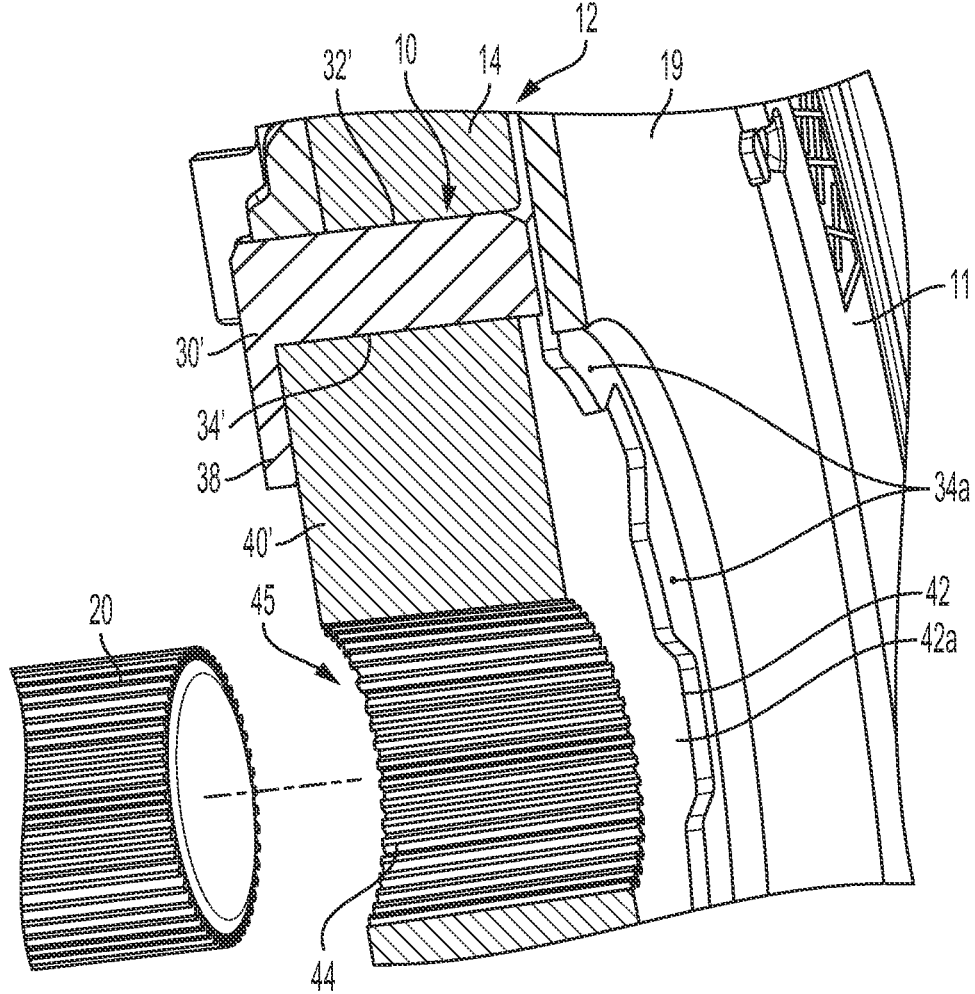
FIG. 6 is a perspective view, in cross section, similar to FIG. 4 in which the spline adapter assembly is assembled in the torque converter one-way clutch in place of the one-way clutch inner race ring and is held in position using the reactor side plate, shown being assembled with a shaft for testing using the universal adapter that includes a radially inner shaft interface surface configured for engagement on the shaft of the testing equipment having a complementary shape.
Figure 7:
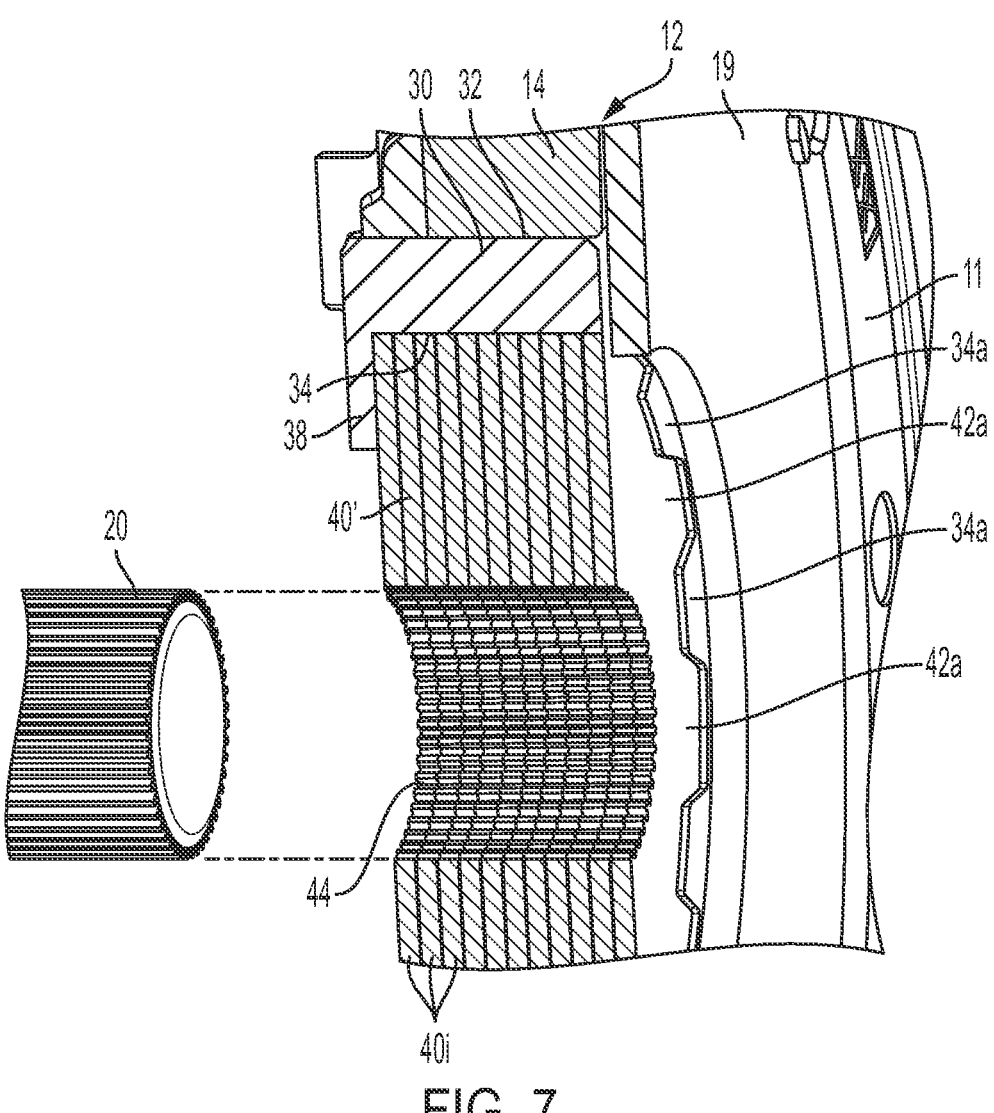
FIG. 7 is a perspective view, in cross-section, similar to FIG. 5 in which the spline adapter assembly including the adapter shown in FIG. 3 is assembled with the one-way clutch in place of the one-way clutch inner race ring and held in position using the reactor side plate being assembled with the radially inner shaft interface surface onto a shaft for the testing equipment having a complementary shape.

As shown in FIGS. 6 and 7, the adapter 40, 40' is held axially between the axial side wall 38 and a reactor side plate 19 which can be part of the torque converter one-way clutch 12.

Still with reference to FIG. 1, the radially inner interface surface 34 includes a plurality of teeth 34*a*, and the radially outer interface surface 42 of the adapter 40, 40' includes a plurality of corresponding teeth 42*a*. The teeth 34*a* and 42*a* can have greater tolerances in this area which makes the formation of the inner race ring 30 less time consuming and less costly. As shown in FIGS. 2 and 3, the radially inner shaft interface surface 44 of the adapter 40, 40' includes a splined opening 45. Here, the splines must have relatively tighter tolerances than the teeth 34*a*, 44*a*.

In each case, as shown in FIGS. 4-7, the inner race ring 30 replaces the original inner race ring of the one-way clutch 12 in the torque converter stator that is being configured for testing. Here, for the sake of completeness, with reference to FIGS. 4 and 5, a torque converter stator 11 that is to be tested is shown, and includes the one-way clutch 12 that has clutch rollers 14 that roll on the radially outer roller body contact surface 32 of the inner race ring 30. The rollers 14 are biased by via springs 15 toward either a locked or unlocked position relative to ramp surfaces 18 defined in pocket 17 of the stator housing 16 in which the rollers 14 are located. The reactor side plate 19 holds the rollers 14 as well as the springs 15 in position and is fastened to the stator housing 16.

Use of the spline adapter assembly 10 allows the adapter assembly inner race ring 30 to be machined for each assembly being tested in order to provide the proper radially outer roller body contact surface 32. It is also possible to provide the adaptor assembly inner race ring 30 as a stock and/or standard size adapter inner race ring that is developed and/or maintained from prior testing for different torque converter one-way clutch configurations, with each preferably having the same radially inner interface surface 34. This then allows one universal adapter 40, 40', or even several universal adapters, that have a radially outer interface surface 42 that is complementary to the standard or common radially inner adapter surface 34 of the inner race ring 30 to be maintained that have a universal radially inner shaft interface surface 44 configuration (or one of several universal radially inner shaft interface surface 44 configurations if different test equipment shaft configurations are present) that match the existing test equipment, in particular the configuration at the end of the shaft 20 for the test equipment, shown for example in FIGS. 6 and 7.

Using this arrangement, the time previously required to make interface tooling is reduced from 12 to 14 weeks down to 1 or 2 weeks as only the inner race ring 30 of the spline adapter assembly has to be machined and an existing adapter 40 can be used to mate with the test equipment.

Further, to the extent that the adapter 40 is formed of a series of flat, laser-cut steel sheets 40*i* that are stacked on top of one another, not only does this allow for faster production using known laser-cutting equipment, but also allows for easier maintenance if either the radially inner shaft interface surface 44 or the radially outer interface surface 42 are damaged, as only the laser-cut steel sheets in the stack that are damaged can be individually replaced. This provides not only for time savings but also reduces costs.

Referring to FIG. 6, a second inner race ring 30' that is generally the same as the inner race ring 30 discussed above is provided, shown assembled in a spline adapter assembly 10. Here, the radially outer roller body contact surface 32' is different from the radially outer roller body contact surface 32 of the inner race ring 30 described above. Here, the second inner race ring 30' has a radially inner interface surface 34' that is the same as the radially inner interface surface 34 of the inner race ring 30 discussed above. This allows a universal adapter 40, 40' to be used in order to connect the torque converter one-way clutch 12 to a shaft 20 for testing, eliminating the need for producing a separate adapter part that is specifically configured to attach a different torque converter one-way clutch to the shaft 20 of the testing equipment, which in this case, has the connection shown as the splined connection 45. Instead, only the radially inner interface surface 34' needs to be machined which can be done with greater tolerances and in a shorter time period.

In another aspect, a method of mounting a torque converter stator 11 having a one-way clutch 12 for testing is provided. The method includes inserting a spline adapter assembly 10 in place of a one-way clutch inner race ring into the torque converter stator 11, with the spline adapter assembly 10 including an adapter inner race ring 30 as discussed above as well as an adapter 40, 40' as discussed above engaged in the adapter inner race ring 30. The radially inner shaft interface surface 44 is then connected with a shaft 20 of testing equipment that has a complementary configuration, in this case, splines that are complementary to the splined opening 45 that forms the radially inner shaft interface surface 44.

The method can further include providing the inner race ring 30 with the cavity 36 as discussed above where the radially inner interface surface 34 forms at least a part of the radially outer wall 39 of the cavity 36. The method can further include holding the adapter 40, 40' axially between the side wall 38 and a reactor side plate 19, as shown in FIGS. 6 and 7.

Here, the method may further include forming the adapter 40' from the steel plate or forming the adapter 40 from a series of flat, laser-cut steel sheets 40i that are stacked on top of one another.

The method may further include providing the radially inner interface surface 34 with a plurality of teeth 34a, and providing the radially outer interface surface 42 of the adapter 40 with a plurality of corresponding teeth 42a, as explained above. However, this interface between the radially inner interface surface 34 and the radially outer interface surface 42 can be configured with any complementary interlocking shapes and is not required to have corresponding teeth that inter-engage.

The method may further include providing the radially inner shaft interface surface 44 as a splined opening 45. However, here it is also possible to provide other types of interlocking connections.

In each case, the use of the universal adapter 40, 40' reduces both the time and costs typically involved in connecting a torque converter stator to a test rig for testing. Also, the adapter 40, 40' can be used with different inner race rings 30, 30'.

Having thus described the presently preferred embodiments in detail, it is to be appreciated and will be apparent to those skilled in the art that many physical changes, only a few of which are exemplified in the detailed description, could be made without altering the inventive concepts and principles embodied therein. It is also to be appreciated that numerous embodiments incorporating only part of the preferred embodiment are possible which do not alter, with respect to those parts, the inventive concepts and principles embodied therein. The present embodiments and optional configurations are therefore to be considered in all respects as exemplary and/or illustrative and not restrictive, the scope that is indicated by the appended claims rather than by the foregoing description, and all alternate embodiments and changes to this embodiment which come within the meaning and range of equivalency of said claims are therefore to be embraced therein.

LIST OF REFERENCE SYMBOLS

10 spline adapter assembly
11 torque converter stator
12 torque converter one-way clutch
14 clutch rollers
15 springs
16 stator housing
17 pocket
18 ramp surfaces
19 reactor side plate
20 shaft
30' inner race ring
32, 32' radially outer roller body contact surface
34, 34' radially inner interface surface
34a teeth
36 cavity
38 axial side wall
39 radial outer wall
40' adapter
40i flat laser-cut steel sheet
42 radially outer interface surface
42a teeth
44 radially inner shaft interface surface
45 splined opening

The invention claimed is:

1. A spline adapter assembly for connecting a torque converter one-way clutch to a shaft for testing, the spline adapter assembly comprising:
   an inner race ring configured to replace an original inner race ring of the torque converter one-way clutch in a torque converter stator, the inner race ring including:
   a radially outer roller body contact surface and a radially inner interface surface; and
   a cavity having an axial side wall and a radial outer wall, the radially inner interface surface forms at least a part of the radial outer wall of the cavity; and
   an adapter having a radially outer interface surface that is complementary to and engaged with the radially inner interface surface of the inner race ring and a radially inner shaft interface surface, wherein the adapter is held axially between the axial side wall and a reactor side plate.

2. The spline adapter assembly of claim 1, wherein the adapter is formed of a steel plate.

3. The spline adapter assembly of claim 1, wherein the adapter is formed of a series of flat, laser-cut, steel sheets that are stacked on top of one another.

4. The spline adapter assembly of claim 1, wherein the radially inner interface surface of the inner race ring includes a plurality of teeth, and the radially outer interface surface of the adapter includes a plurality of corresponding teeth.

5. The spline adapter assembly of claim 1, wherein the radially inner shaft interface surface includes a splined opening.

6. The spline adapter assembly of claim 1, further comprising a second inner race ring including a radially outer roller body contact surface that is different from the radially outer roller body contact surface of the inner race ring, and the second inner race ring having a radially inner interface surface that is the same as the radially inner interface surface of the inner race ring.

7. A method of mounting a torque converter stator having a one-way clutch for testing, the method comprising:

inserting a spline adapter assembly in place of a one-way clutch inner race ring into a torque converter stator, the spline adapter assembly including:

an inner race ring having a radially outer roller body contact surface and a radially inner interface surface, and a cavity having an axial side wall and a radial outer wall, the radially inner interface surface forms at least a part of the radial outer wall of the cavity; and an adapter having a radially outer interface surface that is complementary to and engaged with the radially inner interface surface of the inner race ring and a radially inner shaft interface surface, wherein the adapter is held axially between the axial side wall and a reactor side plate; and connecting the radially inner shaft interface surface with a test machine shaft having a complementary configuration.

8. The method of claim 7, further comprising: forming the adapter from a steel plate.

9. The method of claim 7, further comprising: forming the adapter from a series of flat, laser-cut, steel sheets that are stacked on top of one another.

10. The method of claim 7, further comprising: providing the radially inner interface surface of the inner ring with a plurality of teeth, and providing the radially outer interface surface of the adapter with a plurality of corresponding teeth.

11. The method of claim 7, further comprising: providing the radially inner shaft interface surface as a splined opening.

* * * * *